United States Patent [19]

Cohen

[11] Patent Number: 4,728,297
[45] Date of Patent: Mar. 1, 1988

[54] SOCKET FOR AN ELECTRONIC COMPONENT

[75] Inventor: Salomon Cohen, Lausanne, Switzerland

[73] Assignee: CFG S.A., Morges, Switzerland

[21] Appl. No.: 77,034

[22] Filed: Jul. 22, 1987

Related U.S. Application Data

[63] Continuation of Ser. No. 882,200, Jul. 3, 1986, which is a continuation of Ser. No. 729,266, May 1, 1985, abandoned.

[30] Foreign Application Priority Data

Feb. 1, 1985 [CH] Switzerland .................. 475/85

[51] Int. Cl.⁴ .............................................. H01R 9/09
[52] U.S. Cl. ...................................... 439/331; 439/72; 439/73; 439/525
[58] Field of Search .......... 339/17 LF, 75 M, 75 MP; 439/70–73, 264, 330, 331, 526, 525

[56] References Cited

U.S. PATENT DOCUMENTS

| | | | |
|---|---|---|---|
| 3,409,861 | 11/1968 | Barnes et al. | 339/174 |
| 3,663,920 | 5/1972 | Lapham et al. | 339/17 CF |
| 3,719,917 | 3/1973 | Fischer et al. | 339/17 CF |
| 3,808,582 | 4/1974 | Aldridge et al. | 339/99 R |
| 3,904,262 | 9/1975 | Cutchaw | 339/17 CF |
| 3,907,394 | 9/1975 | Barnes | 439/376 |
| 4,204,722 | 5/1980 | Yasui et al. | 339/17 CF |
| 4,252,390 | 2/1981 | Bowling | 339/17 CF |
| 4,390,220 | 6/1983 | Benasutti | 339/17 CF |
| 4,471,408 | 9/1984 | Martinez | 339/17 CF |

FOREIGN PATENT DOCUMENTS 2434484  3/1980  France .

OTHER PUBLICATIONS

Machine Design, vol. 47, No. 3, Feb. 6, 1975, p. 41, "Vibrationproof Connector Clamps ICs to PCB".

Primary Examiner—John McQuade
Attorney, Agent, or Firm—Ladas & Parry

[57] ABSTRACT

The socket is foreseen for fastening and connecting an electronic component with lined-up conducting pins, whereby the free end of the pins is parallel to the main plane of the component, as it is the case for the SMD components. The socket comprises a carrier of insulating material and contact elements maintained in the carrier and positioned each with its first flexible end in the face of a pin for applying a determined contact pressure on that pin when the component is mounted in the socket. The second end of the contact element can be soldered to a conductor in a circuit. The socket comprises further a comb of insulating material with teeth gliding in a guidance of the carrier. Before the insertion of the component into the socket, the teeth of the comb are placed between the contact elements; after the insertion of the component into the socket and an adequate displacement of the comb, each tooth is in the face of a contact element and applies a pressure to the corresponding pin of the mounted component against the contact element.

18 Claims, 5 Drawing Figures

SOCKET FOR AN ELECTRONIC COMPONENT

This is a continuation of co-pending application Ser. No. 882,200, filed on July 3, 1986, which is a continuation of Ser. No. 729,266, filed May 1, 1985, and now abandoned.

BACKGROUND OF THE INVENTION

1. Field of the invention

This invention concerns a fastening and connecting socket for an electronic component with lined-up conducting pins for the electric connection of the component due to the contact with the pins, whereby the free end of the pins is parallel to the main plane of the component. The electronic components often became more complex and present more connections with the circuit in which they operate. As such a component sometimes happens to be deficient and one would like to replace it without replacing all the circuit around it, it is necessary to use a socket fastening and connecting the component in a detachable way. As a minimal contact pressure between galvanic surfaces is necessary to ensure a good contact of some duration and as, on the other hand, the components become smaller and smaller, the simultaneous insertion of numerous contact pins into flexible sleeves of a socket becomes problematical.

2. Description of the Prior Art

Devices allowing to insert the component without a force—said zero insertion force =ZIF—were developed for components whose connection pins are orthogonal to the main plane of the component.

These devices cannot be used or adapted to the type of component, whose connection pins have their free ends in a plane parallel to the main plane of the component, as it is the case, for instance for the "surface mounted devices", said SMD components.

SUMMARY OF THE INVENTION

It is the purpose of the present invention to solve the insertion problem for SMD components. Therefore, the fastening and connecting socket of the invention is characterized by the fact that it comprises a carrier of insulating material and contact elements maintained in the carrier, crossing it and each positioned in the face of the position foreseen for a pin in order to apply with a first flexible end of the contact element a determined contact pressure onto the pin, when the component with its pins is mounted in the socket, and to present its second end in a way allowing to solder it to a conductor of circuit, that it comprises further a comb of insulating material with teeth, which are narrower than the free space between two adjacent pins of the component and are disposed for corresponding to the contact elements, whereby the back of the comb glides in a gliding guidance of the carrier oriented in the direction of the alignment of the contact elements, whereby before the insertion of the component the comb is in a position where its teeth are between the contact elements and that after reception of the component in the socket and adequate displacement of the comb, each tooth is in the face of a contact element and applies pressure to the corresponding pin of the inserted component against that contact element.

BRIEF DESCRIPTION OF THE DRAWINGS

For a better understanding of the invention embodiments of the socket of the invention will be described as examples, referring to the figures, whereby.

DESCRIPTION OF THE PREFERRED EMBODIMENTS

Figure 1:
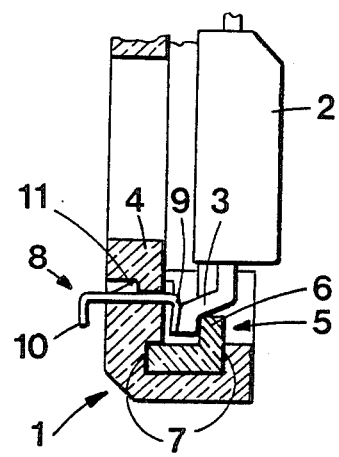
FIG. 1 represents a cross section through a socket with a mounted component with one row of pins.
Figure 2:
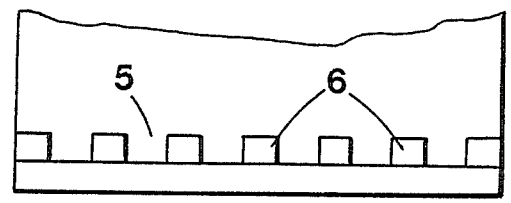
FIG. 2 represents a plane view of the same socket as in FIG. 1, but without the component.

A first embodiment of the socket operates already for a component with one row of pins; this socket is represented in cross-section at FIG. 1 and as view at FIG. 2. The socket 1 and the component 2 can be seen. The component 2 is flat and determines herewith its main plane. The conducting connection pins 3 project out of the side of the component and after a step form have their free ends parallel to the main plane of the component. Such a component—names SMD, i.e. Surface Mounted Device—is made for mounting on a flat surface in which its pins are connected to the conductors of a circuit, which are not represented on the figures. This socket comprises a carrier 4 of insulating material and contact elements 8 crossing the carrier and maintained in it, for example by hooks 11. Each contact element 8 is positioned in the face of the position foreseen for a pin of the component, in order to apply with its first flexible end 9 a determined contact pressure onto the pin 3 when the component with its pins is mounted in the socket; the second end 10 of the contact element is parallel to the main plane of the component 1 and can be soldered to a conductor in the flat surface of the circuit (not represented), as would have been the case with the ends of the conducting pins 3 of the component 2, if it had been mounted directly in the flat circuit without the socket.

In order to prevent a back move of the end of the conducting pin 3 due to the pressure of the flexible end 9 of the contact element, this end of the conducting pin 3 is abutting on a tooth 6 of a comb 5 maintained at its back in a guidance 7 of the carrier 4. The comb can glide over a distance at least equal to half of the pitch between two contact elements 8. The teeth 6 of the comb 5 are narrower than the free space between two adjacent pins 3 of the component.

For the insertion of the component 2 into the socket 1, the teeth 6 of the comb 5 are placed between the contact elements 8. The pins 3 of the component are put onto the flexible ends 9 of the contact elements 8 and the comb 5 is glided over a distance of half a pitch, whereby each tooth 6 becomes an abutment for the corresponding pin 3, on which the contact pressure of the flexible end 9 of a contact element is applied.

Figure 5:
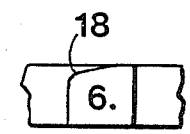
FIG. 5 represents a cross section through a tooth of a comb.

In order to facilitate the gliding displacement of the comb 5 with a reduced lateral force, the tooth edge 18, which comes into contact with the pin 3 of the component 2, is rounded (FIG. 5). Therefore, the contact pressure is progressively built up. This pressure is of approximately 30 gr for each contact. It can now be understood that, but for the lateral friction of the tooth during its gliding, no force is applied to the pins 3 of the component 2 during mounting or removing the component 2 from the socket 1.

Figure 3:
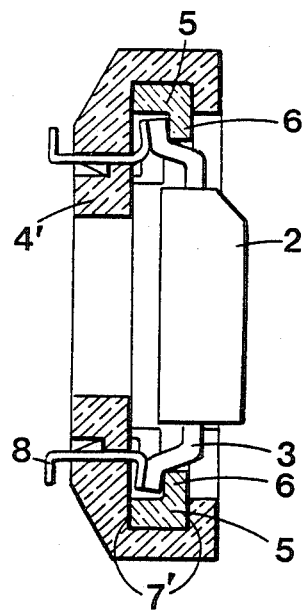
FIG. 3 represents a cross section of a socket for a component with two rows of pins.
Figure 4:
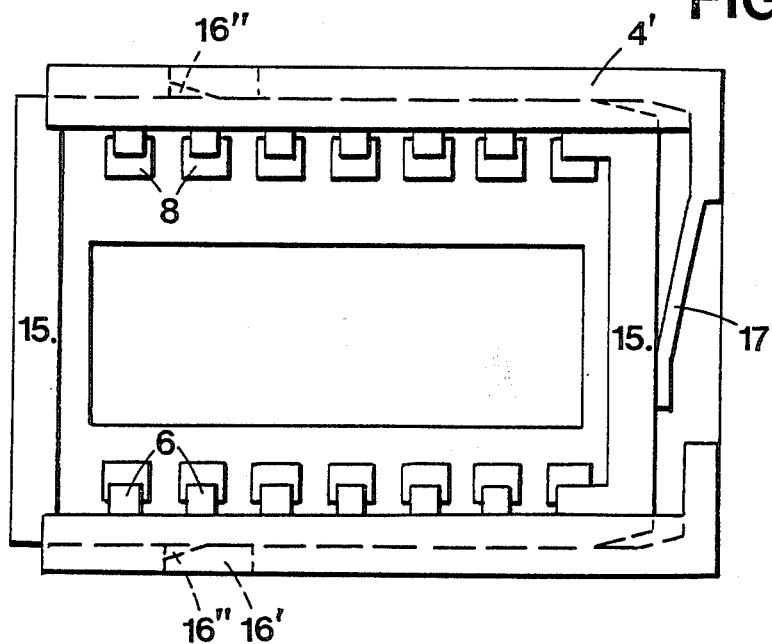
FIG. 4 represents a plane view of the socket of FIG. 3

A second embodiment represented in FIG. 3 and 4 is provided for components with two parallel rows of conducting pins. Two constructions corresponding each to the first embodiment are opposed to each other, the carriers 4 being integrated in one piece as well as the combs 5 which constitute together a frame 15 gliding in the integrated carrier 4'. As the guidances 7' are opposed to each other, they can have a simplified form with respect to the form in the first embodiment.

To prevent a displacement of the frame 15 out of the closed position in which the pins 3 of the component 2 are fastened between the contact elements 8 and the teeth 6, engaging means 16' and 16" are provided respectively on the carrier and on the back of the combs 5 of the frame 15 as recess, respectively as hook. Additionally, a spring 17 is fixed on the carrier 4' or molded with it applies a maintaining pressure onto the frame 15 in order to prevent its displacement out of its closed position.

The man of the art will be able, without difficulty and within the present invention, to choose other means of maintaining the frame. He can use such means for the first embodiment described above, too.

A slight recess can be provided at each position in the carrier where a pin of the component must be maintained. This allows under some circonstances to diminish the height of the socket without impairing its strength (Solution not represented on a figure).

The flexible end 9 of the contact element 8 can receive a form complementary to the form of the pin 3 with which it shall make contact. This end can, of course, be coated in order to improve the electric contact (solution not represented on a figure).

The man of the art will be able without further advice to combine the embodiments. For example for a component with pins on four sides, four sockets of the first embodiment can be combined, whereby the carriers can be made as one piece, individual combs being kept one on each side of the component.

For a lengthy row of connection pins, a unique carrier of the same length as the row to be connected with and at least two independent combs can be provided.

When the pins of the component 2 have a centre of symmetry allowing the insertion of the component into the socket following two directions, unsymmetrical means can be provided on the socket in such a way that only one direction for the insertion is operable; these unsymmetrical means can be a hook of the socket engaging an unsymmetrical means of the casing of the component. Such a hook is not represented on the figures because it is well known to the man of the art.

What is claimed is:

1. A fastening and connecting socket for an electronic component with lined up conducting pins for the electric connection of the component due to contact with the pins, whereby the free end of the pins is parallel to the main plane of the component, characterized by the fact that it comprises a carrier of insulating material and contact elements maintained in the carrier, crossing it and each positioned in the face of the position foreseen for a pin in order to apply with a first flexible end of the contact element a determined contact pressure onto the pin, when the component with its pins is mounted in the socket, and to present its second end in a way allowing to solder it to a conductor of a circuit, that it comprises further a comb of insulating material with teeth, which are narrower than the free space between two adjacent pins of the component and are disposed for corresponding to the contact elements whereby the back of the comb glides in a gliding guidance of the carrier oriented in the direction of the alignment of the contact elements, whereby before the insertion of the component the comb is in a position where its teeth are between the contact elements and that after reception of the component in the socket and adequate displacement of the comb, each tooth is in the face of a contact element and applies pressure to the corresponding pin of the inserted component against that contact element.

2. A fastening and connecting socket of claim 1 for an electronic component with two parallel rows of conducting pins, characterized by the fact that the carrier is provided with two parallel rows of corresponding contact elements, that the ends of the comb corresponding to one row are connected to the ends of the comb corresponding to the other row, whereby the combs connected together build a frame gliding in a corresponding guidance of the carrier.

3. A fastening and connecting socket of claim 2, characterized by the fact that the comb, respectively the frame, includes engaging means with the carrier in order to prevent a displacement of the comb, respectively of the frame, out of the closed position in which the pins of the components are fastened.

4. A fastening and connecting socket of claim 2, characterized by the fact that the carrier includes engaging means with the comb, respectively with the frame, to prevent its displacement out of the closed position in which the pins of the components are fastened.

5. A fastening and connecting socket of claim 3, characterized by the fact that the engaging means of the comb, respectively of the frame, are engaging with the engaging means of the carrier.

6. A fastening and connecting socket of claim 3, characterized by the fact that the engaging means is resilient and is made out of one piece together with the piece it is provided at.

7. A fastening and connecting socket of claim 1, characterized by the fact that the edge of the tooth, which applies pressure to the pin of the component during the displacement of the comb from the open to the closed position, is rounded, in order to build up the pressure progressively.

8. A fastening and connecting socket of claim 1, characterized by the fact that the flexible end of the contact element presents a contact surface complementary to the contact surface of the pin with which it has to make contact.

9. A fastening and connecting socket of claim 3, characterized by the fact that the carrier includes engaging means with the comb, respectively with the frame, to prevent its displacement out of the closed position in which the pins of the components are fastened.

10. A fastening and connecting socket of claim 4, characterized by the fact that the engaging means of the comb, respectively of the frame, are engaging with the engaging means of the carrier.

11. A fastening and connecting socket of claim 4, characterized by the fact that the engaging means is resilient and is made out of one piece together with the piece it is provided at.

12. A fastening and connecting socket of claim 5, characterized by the fact that the engaging means is resilient and is made out of one piece together with the piece it is provided at.

13. A fastening and connecting socket of claim 2, characterized by the fact that the edge of the tooth, which applies pressure to the pin of the component during the displacement of the comb from the open to the closed position, is rounded, in order to build up the pressure progressively.

14. A fastening and connecting socket of claim 3, characterized by the fact that the edge of the tooth, which applies pressure to the pin of the component during the displacement of the comb from the open to the closed position, is rounded, in order to build up the pressure progressively.

15. A fastening and connecting socket of claim 4, characterized by the fact that the edge of the tooth, which applies pressure to the pin of the component during the displacement of the comb from the open to the closed position, is rounded, in order to build up the pressure progressively.

16. A fastening and connecting socket of claim 5, characterized by the fact that the edge of the tooth, which applies pressure to the pin of the component during the displacement of the comb from the open to the closed position, is rounded, in order to build up the pressure progressively.

17. A fastening and connecting socket of claim 6, characterized by the fact that the edge of the tooth, which applies pressure to the pin of the component during the displacement of the comb from the open to the closed position, is rounded, in order to build up the pressure progressively.

18. A fastening and connecting socket of claim 7, characterized by the fact that the flexible end of the contact element presents a contact surface complementary to the contact surface of the pin with which it has to make contact.

* * * * *